US005581572A

United States Patent [19]
Delorme et al.

[11] Patent Number: 5,581,572
[45] Date of Patent: Dec. 3, 1996

[54] WAVELENGTH-TUNABLE, DISTRIBUTED BRAGG REFLECTOR LASER HAVING SELECTIVELY ACTIVATED, VIRTUAL DIFFRACTION GRATINGS

[75] Inventors: Franck Delorme, Villejuif; Christophe Kazmierski, Morangis, both of France

[73] Assignee: France Telecom, Paris, France

[21] Appl. No.: 382,510

[22] Filed: Feb. 2, 1995

[30] Foreign Application Priority Data

Feb. 11, 1994 [FR] France .................................. 94 01577

[51] Int. Cl.$^6$ ...................................................... H01S 3/19
[52] U.S. Cl. ............................. 372/50; 372/96; 372/102; 372/20
[58] Field of Search ............................... 322/96, 102, 50, 322/20

[56] References Cited

U.S. PATENT DOCUMENTS

| | | |
|---|---|---|
| 3,814,498 | 6/1974 | Tomlinson, III et al. . |
| 4,445,218 | 4/1984 | Coldren . |
| 4,885,753 | 12/1989 | Oaki et al. . |
| 5,363,399 | 11/1994 | Yagi . |
| 5,379,318 | 1/1995 | Weber ........................................ 372/96 |

FOREIGN PATENT DOCUMENTS

| | | |
|---|---|---|
| 2684498 | 6/1993 | France . |
| 58-196088 | 2/1984 | Japan . |
| 59-226320 | 12/1984 | Japan . |
| 63-073585 | 8/1988 | Japan . |
| 1124279 | 5/1989 | Japan . |
| 01124279 | 8/1989 | Japan . |
| 2106706 | 4/1983 | United Kingdom . |
| 2270174 | 3/1994 | United Kingdom ................... 372/102 |

OTHER PUBLICATIONS

Agrawal, Govind and Dutta, Niloy, "Semiconductor Lasers", Van Nostrand Reinhold, New York, 1993, p. 369.
Y. Tohmori et al., "Broad range wavelength tunable superstructure garting (SSG) DBR lasers", IEEE Journal of Quantum Electronics, vol. 29, No. 6, Jun. 1993, New York, US, pp. 1817–1823.
Y. Kotaki et al. "Wavelength tunable DFB and DBR lasers for coherent optical fibre communications", IEEE Proceedings-J; vol. 138, No. 2, Apr. 1991.
Y. Yoshikuni et al., "Broadly tunable distributed Bragg reflector lasers with a multiple-phase-shift super-structure grating", paper TuC2, p. 8 Proceedings OFC/1ooC'93, San Jose, USA., 21–26 Feb. 1993. IEEE Photonics Techn. Lett., vol. 4, No. 4, Apr. 1992.

(List continued on next page.)

Primary Examiner—Rodney B. Bovernick
Assistant Examiner—Yisun Song
Attorney, Agent, or Firm—Pearne, Gordon, McCoy & Granger

[57] ABSTRACT

A wavelength-tunably distributed Bragg reflector laser having selectively activated virtual diffraction gratings including a semiconductor guide layer (4) between two other semiconductor confinement layers (6,8) of opposite dopings. A passive part of the laser has sections (SC1, SC2, SC3), each of which include a periodic arrangement (A) spatially modulating the distribution of the carriers or the electric field in the guide layer when a current is injected into the p-n junction formed by the two other layers or where the junction is reverse biased to create a diffraction grating. Each section has an effective optical index cooperating with the corresponding diffraction grating in order to give a predetermined Bragg wavelength for the section.

14 Claims, 7 Drawing Sheets

OTHER PUBLICATIONS

R. C. Alferness et al., "Broadly tunable InGaAsP/InP laser made based on vertical coupler filter with 57 nm tuning range", Appl. Phys. Letters, vol. 60, No. 26, 29 Jun. 1992.

A. Takemoto et al., "Dependence of characteristics of buried grating type DFB laser diodes on the coupling constant", Technical Digest, 12 IEEE International Semiconductor Laser Conference, Sep. 92, Davos, Switzerland, paper E–3.

W. Streifer et al., "Effect of external reflectors on longitudinal modes of distributed feedback lasers", IEEE J. Quantum Electron., QE–11 (1975), p. 154. (no month).

K. Utaka et al., "Analysis of quarter wave shifted DGB lasers", Electron., Lett., 20 (1984), p. 326. (no month).

H. Kogelnik et al., "Coupled wave theory of distributed feedback lasers", J. Appl. Phys 43 (1972), p. 2327. (no month).

Y. Nakano et al., Appl. Phys. Lett., 55 (1989), p. 1606; same authors: Extended Anstracts, 1988 International Conference on Solid State Devices and Materials, Tokyo, 1988, paper D–4–4. (no month).

B. Borchert et al., IEEE Photon. Technol. Lett., 3 (1991), p. 955. (no month).

W. T. Tsang et al., IEEE Photon. Technol. Lett., 4 (1992), p. 212. (no month).

K. Kudo et al., "Reduction of effective linewidth enhancement factor of DFB laser with complex coupling coefficients", IEEE Photon. Technol. Lett., 4 (1992), p. 531. (no month).

Y. Luo et al., "Fabrication and characteristics of gain coupled DFB semiconductor lasers with a corrugated active layer", IEEE J. Quantum Electron., 7 (1991), p. 1724. (no month).

J. Charil et al., "Extremely low threshold operation of 1.5 µm GaInAsP/InP buried ridge stripe laser", Electron. Lett. 25 (1989), p. 1477. (no month).

C. Kazmierski et al., "Universal iron behavior in Zn–, Cd– and Be–doped p–type InP", J. of crystal growth 116 (1992), p. 75. (no month).

M. T. Camargo Silva et al., "MMIC Based Optical Modulator Design", 1992 IEEE MTT–S International Microwave Symposium Digest, New York, pp. 571–574. (no month).

Koch, Thomas L., "Novel Laser Devices", Proceedings of the 13th IEEE International Semiconductor Laser Conference, Sep. 21–25, 1992, Takamatsu, Japan. (no month).

WAVELENGTH-TUNABLE, DISTRIBUTED BRAGG REFLECTOR LASER HAVING SELECTIVELY ACTIVATED, VIRTUAL DIFFRACTION GRATINGS

BACKGROUND OF THE INVENTION

The present invention relates to a wavelength-tunable, distributed Bragg reflector laser.

It more particularly applies to the field of optical telecommunications and makes it possible to obtain a very widely tunable monofrequency laser more especially usable for information transmission by optical fibre.

Various wavelength-tunable, semiconductor monofrequency lasers are known.

The distributed Bragg reflector laser or DBR laser can be discontinuously tuned (in jumps) with a small wavelength tuning range of approximately 10 nm and reference can be made in this connection to the following document:

(1) Y. Kotaki et al., "Wavelength tunable DFB and DBR lasers for coherent optical fibre communications", IEEE Proceedings-J; Vol. 138, No. 2, April 1991.

This known DBR laser has an active section (amplifying part) optically coupled to a passive guiding section, where is etched a Bragg grating permitting a monofrequency light emission. The wavelength tuning of such a laser is obtained by current injection into the section containing said grating.

The variation of the number of charge carriers in said section contributes to modifying the effective optical index of the section and therefore the emission wavelength of the laser.

Other lasers are known comprising Bragg gratings or more complex light guides and in this connection reference should be made to the following documents:

(2) Y. Yoshikuni et al., "Broadly tunable Distributed Bragg Reflector lasers with a multiple-phase-shift superstructure grating", paper TuC2, p.8 Proceedings OFC/IOOC'93, San Jose, U.S.A., 21–26 February 1993. IEEE Photonics Techn. Lett., Vol. 4, No. 4, April 1992.

(3) R. C. ALFERNESS et al., "Broadly tunable InGaAsP/InP laser made based on vertical coupler filter with 57 nm tuning range" Appl. Phys. Letters, Vol. 60, No. 26, 29 Jun. 1992.

These other known lasers make it possible to obtain a discontinuous tuning over a wide range of approximately 60 to 100 nm.

For all the known lasers referred to hereinbefore, the wavelength tuning capacity or wavelength tunability is based on the variation of the optical index by the injection of charge carriers into a light guiding section, which has a more or less complex Bragg grating.

In addition, the main disadvantages of most of the other lasers referred to hereinbefore in conjunction with documents (2) and (3) are the complexity of the Bragg grating or the light guide to be produced; the number of different electric currents having to be controlled in order to obtain said tunability; the limited number of accessible wavelength channels; the difficulty of controlling the spacing between said different wavelength channels; and the extreme complications encountered in continuously tuning said lasers.

SUMMARY OF THE INVENTION

The present invention relates to a distributed Bragg reflector laser, whose wavelength tuning range exceeds that of the DBR lasers according to document (1) and which has a large number of accessible wavelength channels in said tuning range (which is not the case with the lasers known from documents (2) and (3), which have a wider tuning range, but a smaller number of wavelength channels than those of document (1)).

In addition, with the invention, it is easy to control the spacing between the channels to which access can be obtained in the total wavelength tuning range. The control of the different electric currents necessary for the wavelength tuning of a laser according to the invention is also easy.

In a particular embodiment of the invention, it is possible to obtain a very large, discontinuous wavelength tuning range with a single, easily producible Bragg grating.

The principle of the present invention is on the one hand based on the linear integration (in the light propagation direction) of a plurality of structures constituting virtual diffraction gratings and respectively corresponding to different Bragg wavelengths (hence different wavelength tuning ranges) and on the other in the selective activation or selective switching of the gratings by current injection.

It is then possible to obtain a total wavelength tuning range equal to several times the tuning range corresponding to the current injection into a single grating and therefore well above that of conventional DBR lasers of the type described in document (1).

In the laser according to the invention, a single diffraction grating is active at a given time. Thus, in the opposite case, the activated grating closest to the active part of the laser would mask the effect of the other activated grating or gratings.

In the invention, the injection of a current locally creates a diffraction grating and then makes it possible to tune the laser.

The switching of the current from one section to the other of the passive part of the laser (each of these sections corresponding to a diffraction grating) eliminates the previously created grating and defines a new grating, which is Bragg wavelength displaced and tunable on other wavelength channels.

More specifically, the present invention relates to a wavelength-tunable, distributed Bragg reflector laser, which is characterized in that it has, between first and second light semiconductor confinement layers, a light guiding semiconductor layer having an active part constituting a light amplifying medium and defining an active part of the laser, and a passive part optically coupled to the active part of the guide layer and defining a passive part of the laser, the confinement layers having opposite doping types, which thus form, a p-n junction, and in that the passive part of the laser has a plurality of switching sections, each switching section comprising a periodic arrangement able to spatially modulate the distribution of the charge carriers or the electric field in the passive part of the guide layer contained in said section, when an electric current is injected into the p-n junction part relative to said section or said p-n junction part is reverse biased, so as to create, in said section, a diffraction grating whose pitch spacing is equal to the period of the arrangement. Each section also having a given, effective optical index able to cooperate with the corresponding diffraction grating in order to lead to a predetermined Bragg wavelength for said section, so that the laser is wavelength-tunable by selective activation of the diffraction gratings.

According to a first embodiment of the laser according to the invention, the periodic arrangements or layouts are located in one of the first and second semiconductor confinement layers, each comprising a sequence of alternately p-type and n-type semiconductor zones.

According to a second embodiment, the periodic arrangements are located in one of the first and second semiconductor confinement layers and each comprises a sequence of undoped semiconductor zones or semi-insulating zones, alternating with semiconductor zones having the same doping type as that of the semiconductor layer in which these periodic arrangements are located.

In the first embodiment of the invention, the switching sections have the same effective optical index and the periodic arrangements respectively corresponding to these sections have different periods from one another.

In a second embodiment of the invention, the switching sections have different effective optical indexes and the periodic arrangements respectively corresponding to these sections have the same period.

In a third embodiment of the invention, the switching sections have different effective optical indexes and the periodic arrangements respectively corresponding to these sections have different periods.

In the second and third embodiments of the invention, at least one of the switching sections can incorporate a stack of at least two material layers, whose optical indexes are different and chosen so as to lead to the effective optical index of said section.

The passive part of the laser can also incorporate an intermediate section, referred to as the phase section, located between the switching sections and the active part of the laser and permitting a continuous tuning of the emission wavelength of the laser by injecting an electric current into the p-n junction part relative to said intermediate section or by reverse biasing of said junction.

The laser according to the invention can also incorporate means for the selective injection of current into the p-n junction parts respectively corresponding to the switching sections, each periodic arrangement being able to spatially modulate the entry of the current into the guide layer part corresponding to said arrangement.

As a variant, the laser can also incorporate means for the selective reverse biasing of the p-n junction parts respectively corresponding to the switching sections, each periodic arrangement being able to spatially modulate the electric field in the p-n junction part corresponding to said arrangement.

BRIEF DESCRIPTION OF THE DRAWINGS

The invention is described in greater detail hereinafter relative to non-limitative embodiments and with reference to the attached drawings, wherein show.

DETAILED DESCRIPTION OF THE PREFERRED EMBODIMENTS

Figure 1:
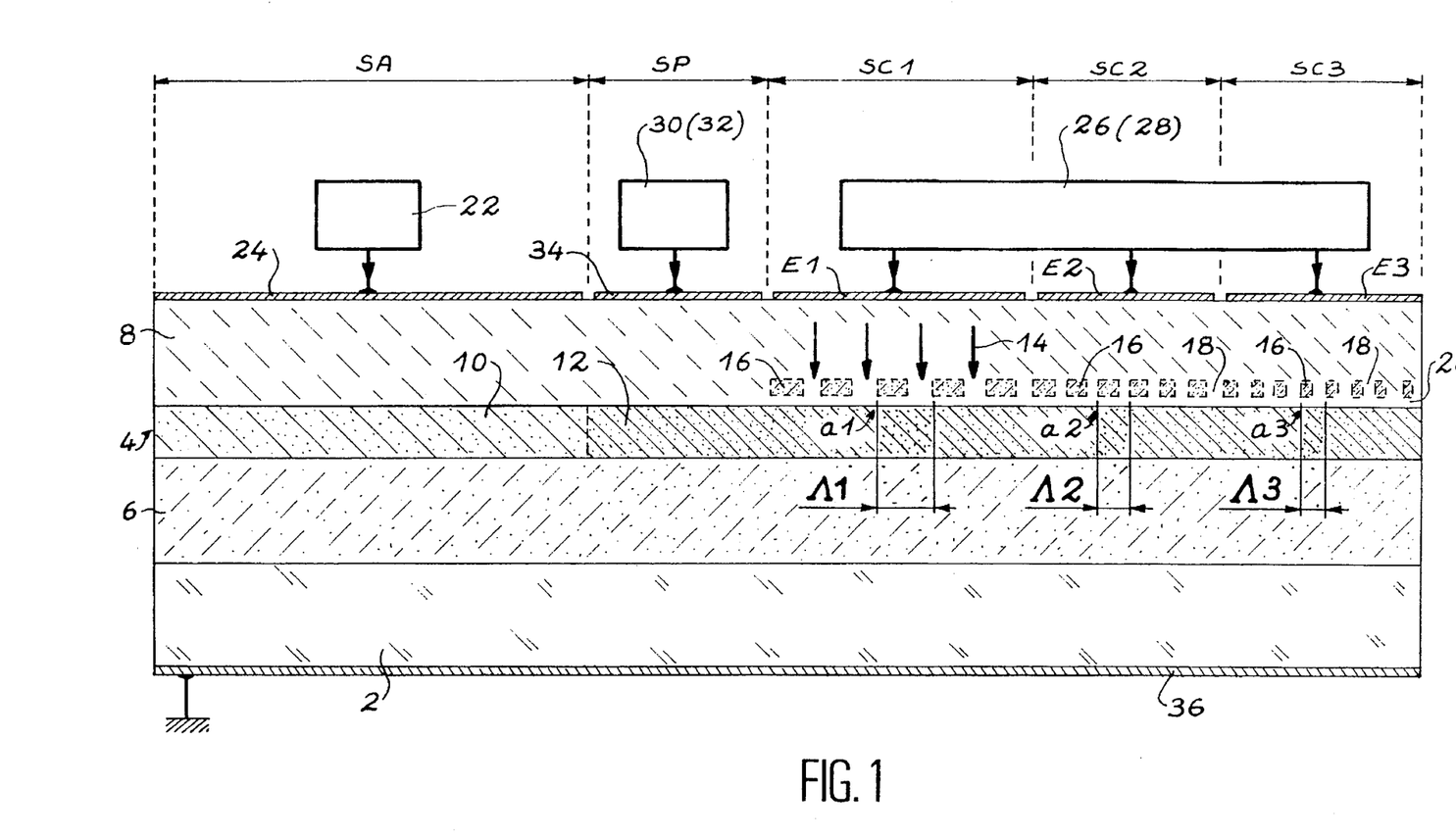
FIG. 1 a diagrammatic view of an embodiment of the laser according to the invention.

A laser according to the invention, and which is diagrammatically shown in FIG. 1, results from the modification of a conventional DBR laser and the introduction, into the guidance section of the laser, of different switchable virtual gratings in place of the grating conventionally etched in the guidance section.

In order to obtain the effective switching of the gratings, in place of the diffraction grating of a conventional nature permanently etched in a light guiding layer, use is made of virtual diffraction gratings activated by the injection of charge carriers and having in each case the advantage of only existing if a current is injected into the corresponding section of the laser, which is perfectly in accordance with the needs of a laser according to the invention.

On a semiconductor substrate 2, the laser of FIG. 1 has a stack of semiconductor layers constituted by a semiconductor light guiding layer 4 placed between a lower semiconductor or confinement layer 6 and an upper semiconductor or confinement layer 8, whose dopings are opposite and which thus form a p-n junction. These layers 6 and 8 have forbidden band widths greater than that of the light guiding layer 4 and are able to confine light in the light guiding layer 4. The light guiding layer 4 comprises an active part 10 constituting a light amplifying medium and a passive part 12 optically coupled to the active part 10.

The active part 10 and the passive part 12 of the layer 4 respectively define an active part SA (or active section) of the laser and a passive part (or passive section) of the laser. According to the invention, the passive part of the laser has a plurality of switching sections.

In the embodiment shown in FIG. 1, there are three switching sections respectively designated SC1, SC2 and SC3.

In its passive part, the laser of FIG. 1 also has another section SP, called the phase section and reference will be made hereinafter thereto.

In the embodiment shown, the passive part of the laser is consequently constituted by the sections SP,SC1,SC2 and SC3.

Each switching section has a periodic arrangement or layout formed in the upper confinement layer 8 and able to spatially modulate an electric current injected into the part of the p-n junction corresponding to said section.

Therefore, in the embodiment shown, there are three periodic arrangements a1,a2,a3 of this type, which are positioned in series along the passive part 12 of the guide layer and whose respective periods are designated $\Lambda 1$, $\Lambda 2$ and $\Lambda 3$.

As will be shown hereinafter the laser is tuned by injecting an electric current into a switching current.

In the embodiment shown, only the p-n junction of switching section SC1 receives a current and the spatial modulation of the injected current is symbolized by the arrows 14. The thus modulated current leads to concentration variations with respect to the charge carriers in the part of the light guiding layer layer 4 corresponding to the switching section SC1. In turn, these charge carriers produce a spatial modulation of the optical index in the corresponding part of the layer 4.

This gives an index grating, whose pitch spacing is equal to the period of the considered periodic arrangement ($\Lambda 1$ for section SC1).

In the embodiment shown in FIG. 1, the passive part 12 (made from an intrinsic semiconductor material) of the light guiding layer 4 is between the lower confinement layer 6 made from type n semiconductor material and the upper confinement layer 8 made from type p semiconductor material, on the type n semiconductor substrate 2.

Each of the periodic arrangements has zones 16 made from a type n semiconductor, optical confinement material and are located in the upper confinement layer 8 and can be in the vicinity of the passive part 12 of the light guiding layer 4 (as in FIG. 1) or in contact therewith. These zones 16 alternate with zones 18 made from the material constituting the upper confinement layer 8 (type p semiconductor).

It is pointed out that the thickness of the type p semiconductor layer which can exist between the periodic arrangements positioned in series and the passsive part 12 of the light guiding layer 4 is very small, e.g. below 50 nm.

In the active section SA, the laser according to FIG. 1 also has means 22 for injecting an electric current into the upper confinement layer 8, by means of an electrode 24 in the upper confinement layer 8, in order to bring about a stimulated light emission by the active part 10 of the light guiding layer 4.

The laser of FIG. 1 also has means 26 for injecting an electric current into the upper confinement layer 8, into one of the chosen switching sections SC1,SC2 and SC3, respectively by means of electrodes E1,E2 and E3 of the upper confinement layer 8, and for the forward biasing of the p-n junction formed by the upper and lower confinement layers 8,6.

With the period $\Lambda 1$ or $\Lambda 2$ or $\Lambda 3$ (as a function of the chosen section), the semiconductor zones 16 block the arrival of current at the passive part 12 of the light guiding layer 4. Thus, at the zones 16, there are p-n-i-n-type blocking junctions, whereas at the zones 18 there are p-i-n-type conductive junctions.

In a not shown variant of the laser of FIG. 1, the substrate 2 is of type p and this also applies for the lower confinement layer 6, whilst the layer 8 is of the n type. The zones 16 are then of the p type and alternate with zones 18 of the n type layer 8.

In another not shown variant, the zones 16 are replaced by zones made from a semi-insulating material and an undoped semiconductor material, and the zones 18, which form part of the upper confinement layer 8, are of the p or respectively n type if the upper confinement layer 8 is of the p or respectively n type, in which case the lower confinement layer layer 6 is obviously of the n or respectively p type.

In another laser according to the invention, the means 26 are replaced by means 28 for the selective reverse biasing of the p-n junction parts respectively corresponding to the sections SC1,SC2 and SC3.

In this case, it is the spatial modulation of the electric field in the thus reverse biased p-n junction part (and therefore in the corresponding guide layer part), which creates the index grating as a result of electrooptical effects.

The phase section SP, which is optional, permits a continuous tuning of the laser of FIG. 1. In order to do this, the phase section SP is provided with means 30 for injecting current into the corresponding part of the upper confinement layer 8, by means of an electrode 34 provided in the upper confinement layer 8 and as can be seen in FIG. 1.

As a variant, it is possible to use the reverse biasing means 32 of the p-n junction part corresponding to the phase section SP.

In the laser of FIG. 1, the substrate 2 is provided with an earthed or ground electrode 36.

The activation of the virtual diffraction grating of one of the sections SC1,SC2 and SC3, as a result of the means 26 or 28, permits the appearance in the chosen section of a diffraction grating, whose amplitude can be modulated.

Thus, a Bragg grating is provided constituted by the combination of the diffraction grating and the corresponding part of the light guiding layer 4. This Bragg grating is characterized by a Bragg wavelength $\lambda B1$ for the section SC1, $\lambda B2$ for the section SC2 and $\lambda B3$ for the section SC3.

This Bragg wavelength is linked with the effective optical index Neff of the optical guide constituted by the passive part 12 of the guiding layer 4 and by the confinement layers 6 and 8, as well as to the pitch spacing $\Lambda 1$ or $\Lambda 2$ or $\Lambda 3$ of the corresponding activated diffraction grating and to the order p of said diffraction grating by the following formula:

$$\lambda Bi = \Lambda i . 2 Neff/p.$$

In this formula, the index i assumes one of the values 1,2 and 3 as a function of the section involved.

Figure 2:
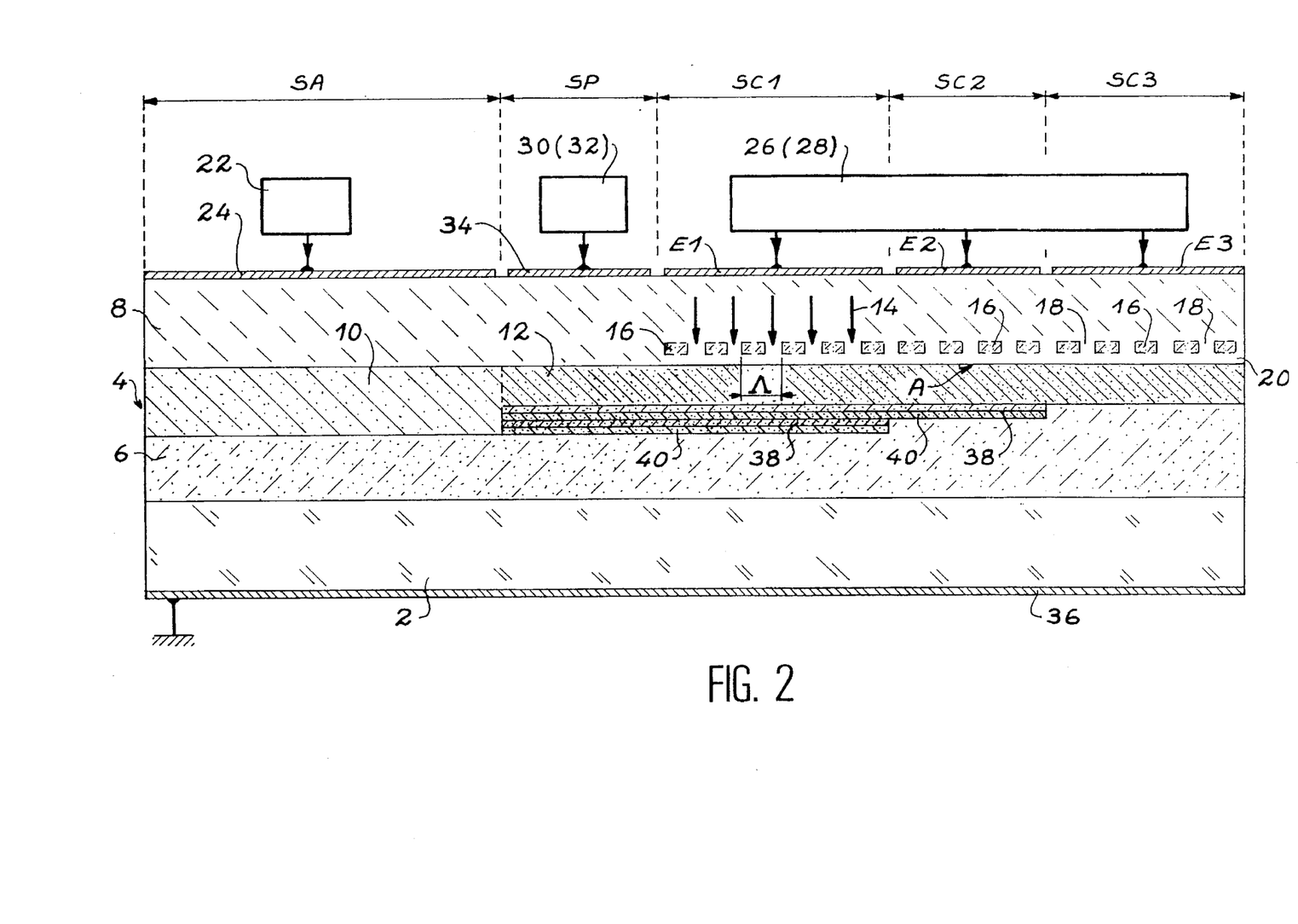
FIG. 2 a diagrammatic view of another embodiment of the laser according to the invention.

A second embodiment of the laser according to the invention is diagrammatically shown in FIG. 2. In the second embodiment, there is only a single periodic arrangement A of period $\Lambda$ extending along the passive part 12 of the light guiding layer 4. In other words, all the periodic arrangements positioned in series in FIG. 1 now have the same period $\Lambda$.

However, unlike in the case of the laser of FIG. 1, in which the effective index of the optical guide of the passive part of the laser is constant, the switching sections SC1,SC2 and SC3 of the laser of FIG. 2 have different effective optical indexes.

Thus, a diffraction grating is again made to appear in that of the switching sections which have been chosen using the means 26 or 28 but, in the case of FIG. 2, the Bragg grating corresponding to the activated switching section is characterized by a Bragg wavelength given by the following formula:

$$\lambda Bi = \Lambda . 2 Ni/p$$

In this formula, the index i assumes one of the values 1,2 and 3 as a function of the chosen switching section and Ni represents the effective optical index corresponding to said section.

Thus, in the case of FIG. 2, in order to obtain gratings having the same pitch spacing and necessary for obtaining the different Bragg wavelengths, it is only necessary to have a single periodic arrangement constituted by the alternation of zones 16 and 18, but it is necessary to locally modify the effective optical index of the optical guide of the passive section of the laser.

In order to do this, to the passive part 12_ are added alternate layers of a first material and a second material having different optical indexes.

More specifically, in the laser of FIG. 2, the passive part of the light guiding layer 12 is provided, on the side of the lower confinement layer 6, with a stack of layers 38 of a first material having an optical index n1 and alternating with layers 40 of a second material having an optical index n2 different from n1. The layers 38 and 40 do not necessarily have the same thickness.

FIG. 2 shows that this stack of alternate layers 38 and 40 has been etched in the form of stairs. At one end of the stack, all the layers 38 and 40 remain, whereas at the other end none of the layers 38 and 40 remains. There is a passage from one stair to the next by eliminating a pair of layers 38 and 40.

In the embodiment shown in FIG. 2, there are two pairs of layers 38 and 40 and therefore two stairs and consequently three zones respectively corresponding to the three switching sections.

The stack of layers 38 and 40 also extends into the phase section SP in order to simplify the manufacture of the laser, but could also be eliminated from the phase section.

Combined with the corresponding diffraction gratings, these zones make it possible to obtain three Bragg gratings and therefore obtain three Bragg wavelengths respectively designated λB1, λB2 and λB3.

The second embodiment of the laser according to the present invention, which is diagrammatically shown in FIG. 2, is simpler to manufacture than the first embodiment FIG. 1 because it is only necessary to have a single periodic arrangement, no matter what the number of switching sections to be produced.

As previously, a diffraction grating only remains in a switching section which has been selected if a current is injected into it. In the case of FIG. 2, the section SC1 and the arrows 14 symbolize the modulation of the current injected into the section SC1.

In a purely indicative and in no way limitative manner, a laser according to the invention can be produced having an active section SA with a length of 500 µm, a phase section SP of length 100 µm and three virtual grating switching sections SC1,SC2,SC3 each having a length of 150 µm, by using InP for the confinement layers 6,8 of the laser, the active material of the laser being 1.55 µm InGaAsP and the active part of the light guiding layer 4 is of 1.3 µm InGaAsP.

Use is made of a single periodic arrangement obtained with respectively n and p doped InP layers. The Bragg wavelengths of the three sections are respectively λB1= 1.540 µm, λB2=1.532 µm and λB3=1.524 µm.

Figure 2A:
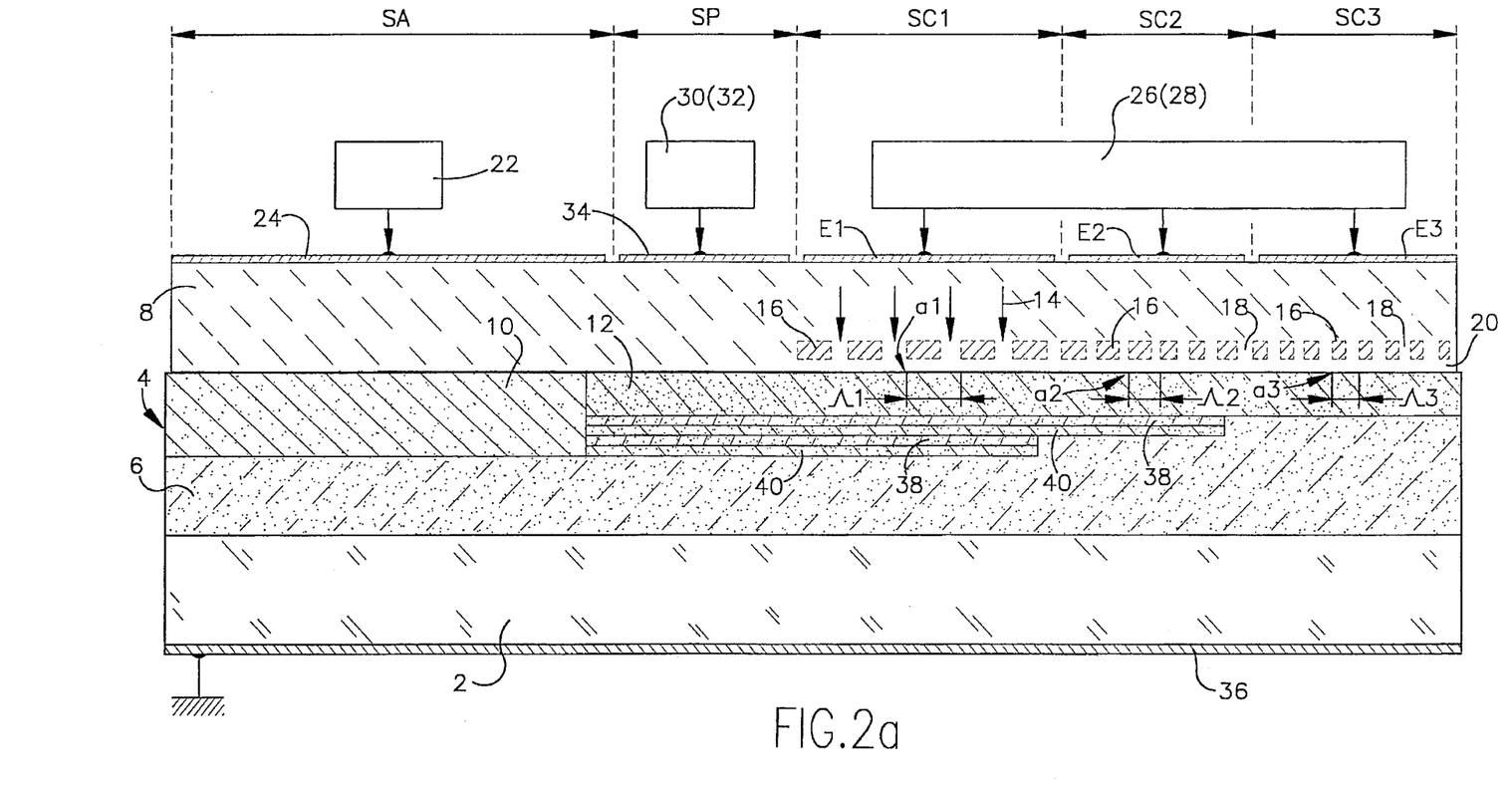
FIG. 2a is a diagrammatic view of another embodiment of the laser according to the invention.

FIG. 2a illustrates a third embodiment which includes features of the first two embodiments previously discussed and illustrated in FIGS. 1 and 2. Structural features shown in FIGS. 1 and 2 have been given identical reference numerals in FIG. 2a. The prior discussion and FIGS. 1 and 2 fully disclose the subject matter illustrated in FIG. 2a, and make the third embodiment apparent and readily appreciated to one skilled in the art. As such, further description of the third embodiment is not considered necessary, and has been omitted herefrom.

Figure 3:
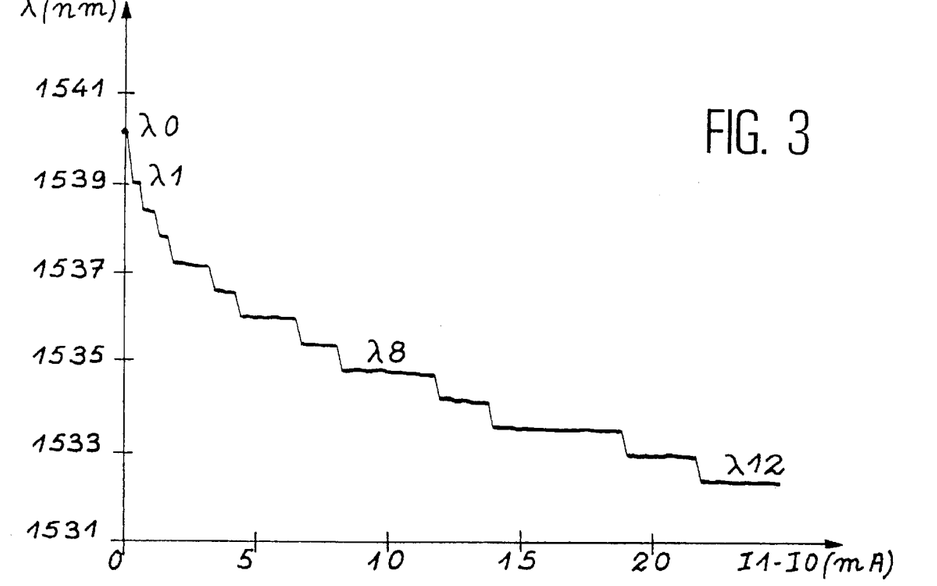
FIGS. 3 to 5 curves relative to the wavelength tuning of a laser according to the invention of the type according to FIG. 2.
Figure 4:
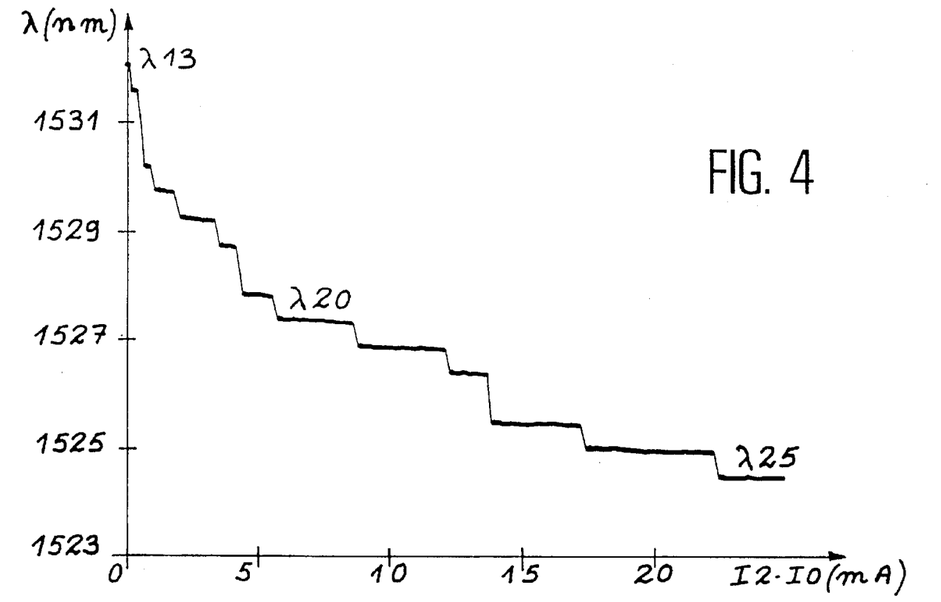
Figure 5:
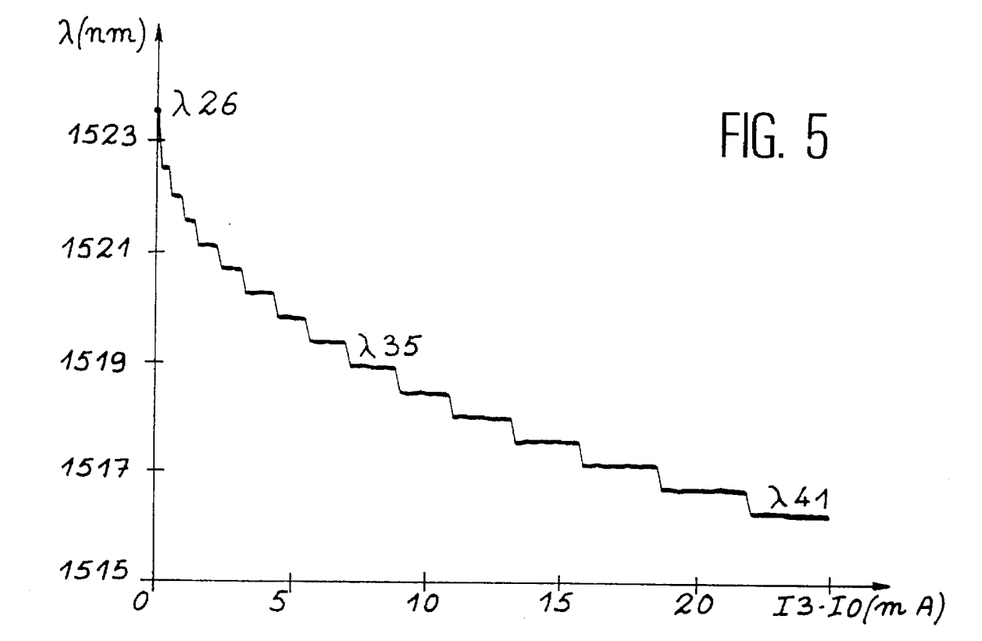

The curves of FIGS. 3, 4 and 5 represent the results relative to the wavelength tuning capacity obtainable with such a laser according to the invention. Each of the curves of FIGS. 3 to 5 represents the emission wavelength variation λ of the laser (expressed in nm) as a function of the difference (expressed in mA) between the intensity of the current injected into the section corresponding to the curve in question and the intensity I0 of the low current necessary for creating the corresponding diffraction grating. The intensity of the injected current is designated I1 for section SC1 (FIG. 3), I2 for section SC2 (FIG. 4) and I3 for section SC3 (FIG. 5).

In the case of FIG. 3, only the grating of section SC1 is active, in the case of FIG. 4 only the grating of section SC2 is active and in the case of FIG. 5 only the grating of section SC3 is active.

FIG. 3 shows the tuning range obtained for a current injected into section SC1, FIG. 4 the tuning range obtained for a current injected into section SC2 and FIG. 5 the tuning range obtained for a current injected into section SC3.

For FIG. 3 there are thirteen wavelength channels respectively designated λ0, λ1 ... λ12.

For FIG. 4 there are thirteen wavelength channels respectively designated λ13 ... λ25.

For FIG. 5 there are sixteen wavelength channels respectively designated λ26 ... λ41.

The difference between the wavelengths of the extreme channels is:

in the case of FIG. 3: λ12–λ0=7.88 nm
in the case of FIG. 4: λ25–λ13=7.68 nm
in the case of FIG. 5: λ41–λ26=7.55 nm.

The sum of the wavelength tuning ranges of the three switching sections exceeds the tuning range relative to a conventional DBR laser of the type described in document (1) where the said range is 10 nm, whereas in the present case the total tuning range is approximately 24 nm, i.e. three times that obtained by injecting current into a single switching section such as e.g. section SC2, which corresponds to a tuning range of approximately 8 nm.

It is pointed out that in the case of FIGS. 3, 4 and 5, the curves are plotted assuming that no current is injected into the phase section SP of the laser.

As mentioned hereinbefore, the supplementary interest of a laser according to the invention is the possibility of having a continuous tunability by current injection into the phase section SP. As for discontinuous tunability, this continuous tunability is multiplied by the number of switching sections of the laser.

Thus, advantageously, an operation similar to that of a conventional DBR laser is obtained for each switching section. It is therefore simple to manufacture a laser according to the invention as compared with the manufacture of other, widely tunable DBR lasers as referred to hereinbefore.

The control both of the spacing between the wavelength channels (height of the stairs in FIGS. 3 to 5) and the number of said channels and the control of the various currents used for changing the laser wavelength is simpler as compared with known, widely tunable DBR lasers.

In connection with FIGS. 3 to 5, it is pointed out that if the intensity of the current of the phase section is not zero, a curve of the same type as that of the said drawings is obtained, but which is slightly downwardly displaced to the maximum of the wavelength channel.

It is also pointed out that it is possible to obtain a laser according to the invention having, like that of FIG. 1, periodic arrangements of different periods and, like that of FIG. 2, pairs of layers which locally modify the effective optical index in the passive part of the laser.

It is also pointed out that it would be possible to produce a laser according to the invention in which the periodic arrangements were in the lower confinement layer 6 and the effective optical index modification layers in the upper confinement layer 8.

A description will now be given with reference to FIGS. 6 to 9 of an embodiment of a process for the production of a laser according to the invention, having a single virtual diffraction grating for three switching sections respectively associated with different effective optical indexes, as in the case of FIG. 2.

Figure 6:
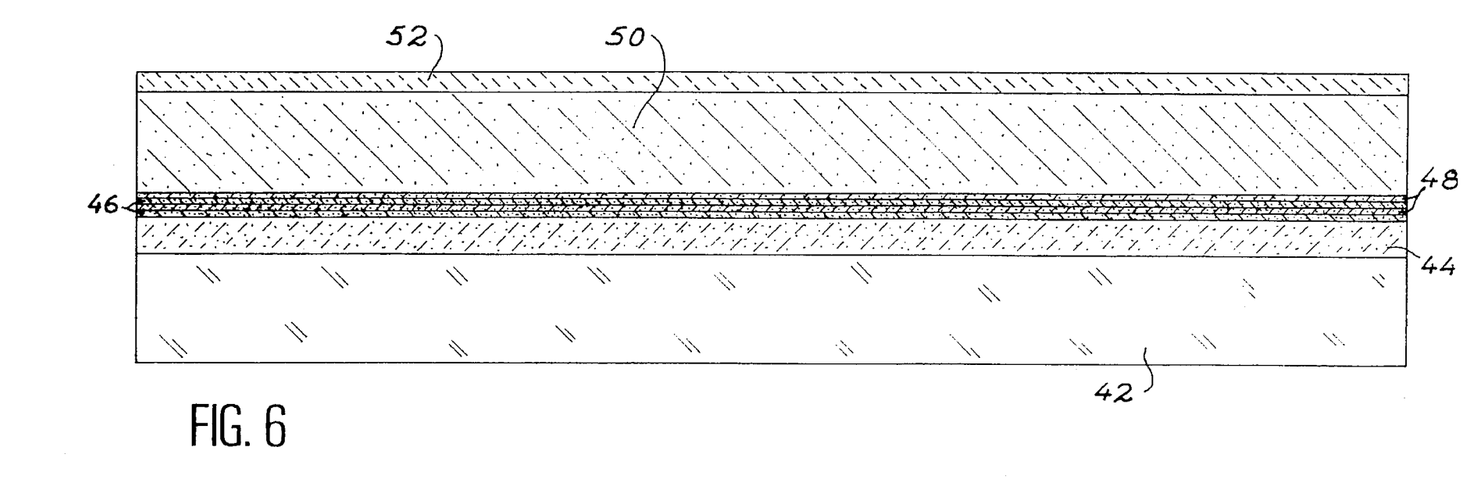
FIGS. 6 to 9 diagrammatically different stages of a process for the production of a laser according to the invention.

According to a first stage of this process (FIG. 6), growth takes place by epitaxy on a n$^+$-doped InP substrate 42 of:

a n$^+$-doped InP buffer layer 44, two pairs of layers 46 and 48 necessary for defining the three different effective optical index zones, the two layers 46 being of undoped InGaAsP and the two layers 48 of n-doped InP, the undoped 1.5 µm InGaAsP active layer 50 (the composition of the active layer 50 corresponding to a light emission in the range centered on 1.5 µm), a doped InP protective layer 52.

Figure 7:
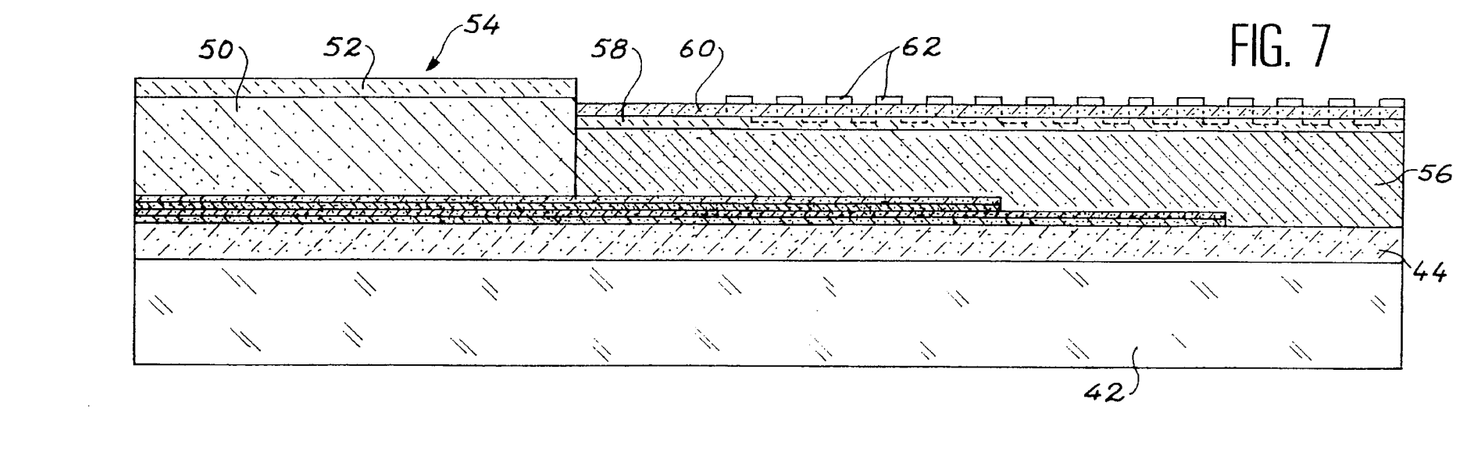
Figure 8:
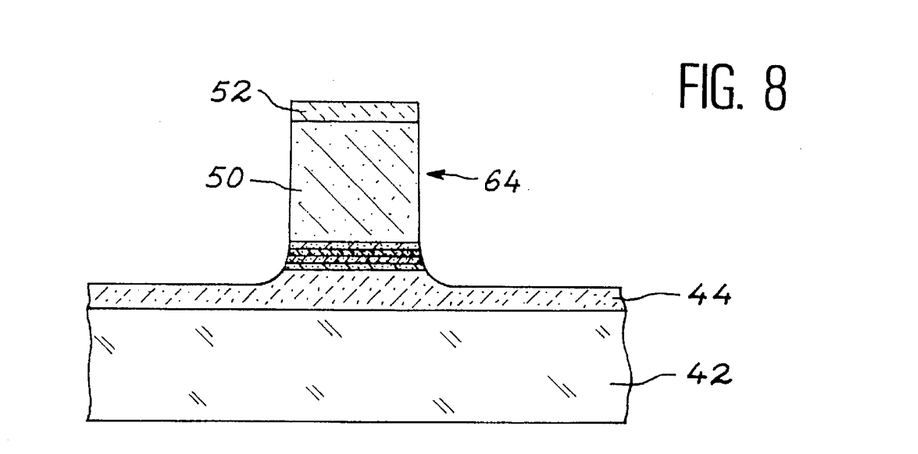

In a second stage diagrammatically illustrated by FIG. 7, the protective layer 52 and the active layer 50 are etched in order to define the active part 54 of the laser.

In a third stage (FIG. 7) etching takes place of the pairs of layers 46 and 48 so as to define the three switching sections of the laser corresponding to different effective optical indexes.

In a fourth stage (FIG. 7), growth successively takes place by selective epitaxy of the following layers in the parts other than the active part of the laser:

a 1.3 µm InGaAsP layer 56, a p⁺-doped InP layer 58, a n⁺-doped InP layer 60, said layers 58 and 60 being used for obtaining the aforementioned periodic arrangement.

In a fifth stage (FIG. 7), removal takes place of the part of the n⁺-doped InP layer 60 in the phase section of the laser and the periodic arrangement is etched making it possible to obtain the virtual diffraction grating, in the three switching sections, through a mask 62 obtained by an electronic masking means or by a holographic exposure.

In a sixth stage the stripe 64 of the laser is etched perpendicular to the lines of the diffraction grating. This stage is diagrammatically illustrated in FIG. 8, which is a cross-sectional view of the active part of the laser during manufacture.

Figure 9:
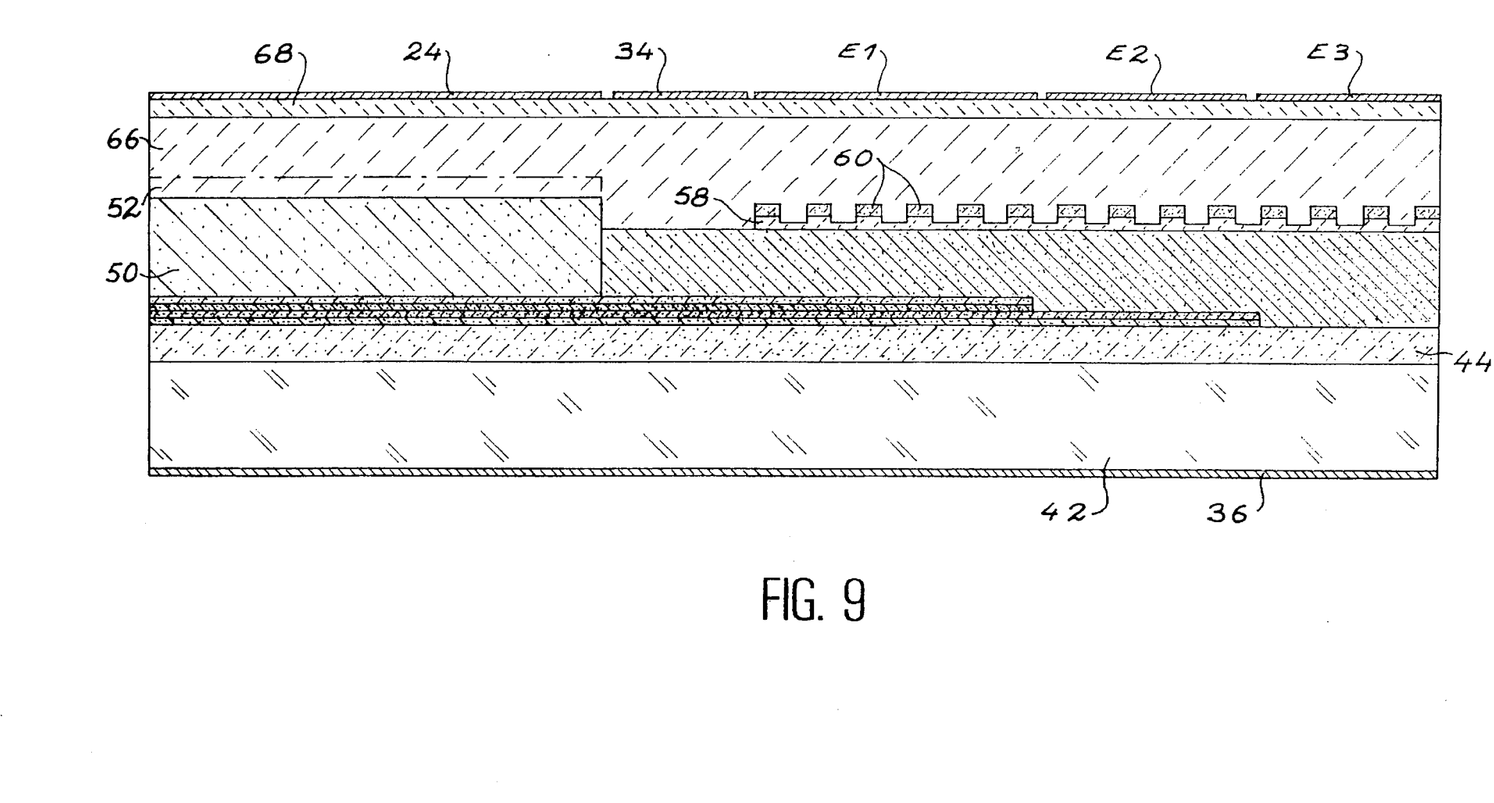

Epitaxy is repeated in a seventh stage (FIG. 9). More specifically, the upper confinement layer 66 of the p⁺-doped InP laser is formed, followed by a p⁺-doped InGaAs contact layer 68.

In an eighth stage (FIG. 9) where the laser is shown in longitudinal section in accordance with the light propagation direction (as is also the case for FIGS. 6 and 7), the lower metallic contact 36 is produced on the substrate 42, as well as the various upper metallic contacts of the different parts of the laser, namely:

the contact 24 corresponding to the active part of the laser, the contact 34 corresponding to the phase section of the laser and the contacts E1, E2 and E3 respectively corresponding to the three switching sections of the laser.

We claim:

1. Wavelength-tunable, distributed Bragg reflector laser, comprising, between first (6) and second (8) light confinement semiconductor layers, a light guiding semiconductor layer (4) having an active part (10) constituting a light amplifying medium and defining an active part of the laser, and a passive part (12) optically coupled to the active part of the guiding layer and defining a passive part of the laser, the confinement layers having opposite doping types and thus forming a p-n junction, and wherein the passive part of the laser has a plurality of switching sections (SC1,SC2,SC3) each switching section comprising a periodic arrangement a1,a2,a3,A) able to spatially modulate the distribution of the charge carriers or the electric field in the passive part of the guiding layer contained in said section when an electric current is injected into the p-n junction part relative to said section or said p-n junction part is reverse biased, so as to create, in said section, a diffraction grating whose pitch spacing is equal to the period of the arrangement, each section also having a given effective optical index able to cooperate with the corresponding diffraction grating in order to lead to a predetermined Bragg wavelength for said section, so that the laser is wavelength-tunable by selective activation of the diffraction gratings, and said switching sections (SC1,SC2,SC3) have different effective optical indexes and the periodic arrangements (A) respectively corresponding to said sections have the same period.

2. Laser according to claim 1, Wavelength-tunable, distributed Bragg reflector laser, comprising, between first (6) and second (8) light confinement semiconductor layers, a light guiding semiconductor layer (4) having an active part (10) constituting a light amplifying medium and defining an active part of the laser, and a passive part (12) optically coupled to the active part of the guiding layer and defining a passive part of the laser, the confinement layers having opposite doping types and thus forming a p-n junction, and wherein the passive part of the laser has a plurality of switching sections (SC1,SC2,SC3), each switching section comprising a periodic arrangement (a1,a2,a3,A) able to spatially modulate the distribution of the charge carriers or the electric field in the passive part of the guiding layer contained in said section when an electric current is injected into the p-n junction part relative to said section or said p-n junction part is reverse biased, so as to create, in said section, diffraction grating whose pitch spacing is equal to the period of the arrangement, each section also having a given effective optical index able to cooperate with the corresponding diffraction grating in order to lead to a predetermined Bragg wavelength for said section, so that the laser is wavelength-tunable by selective activation of the diffraction gratings, and said switching sections (SC1,SC2,SC3) have different effective optical indexes and the periodic arrangements respectively corresponding to these sections have different periods.

3. Laser according to claim 1, wherein the periodic arrangements are located in one of the first (6) and second (8) semiconductor confinement layers and comprise a sequence of semiconductor zones (16,18), alternately of type p and type n.

4. Laser according to claim 1, wherein the periodic arrangements are located in one of the first (6) and second (8) semiconductor confinement layers and comprise a sequence of undoped semiconductor zones or semi-insulating zones, alternating with semiconductor zones having a doping type identical to that of the semiconductor confinement layer in which said periodic arrangements are located.

5. Laser according to claim 1, wherein at least one of the switching sections incorporates a stack of at least two layers of materials (38,40) having different optical indexes and chosen in order to bring about the effective optical index of said section.

6. Laser according to claim 1, wherein the passive part of the laser also incorporates an intermediate phase section (SP) positioned between the switching sections (SC1,SC2, SC3) and the active part (SA) of the laser and permitting a continuous tuning of the emission wavelength of the laser by injecting an electric current into the p-n junction part relative to said intermediate section or by reverse biasing of said junction.

7. Laser according to claim 1, further comprising means (26) for injecting an electric current selectively into the p-n junction parts respectively corresponding to the switching sections, each periodic arrangement being able to spatially modulate the entry of electric current into the guidance layer part corresponding to said arrangement.

8. Laser according to claim 1, further comprising means (28) for the selective reverse biasing of the p-n junction parts respectively corresponding to the switching sections, each periodic arrangement being able to spatially modulate the electric field in the p-n junction part corresponding to said arrangement.

9. Laser according to claim 2, wherein at least one of the switching sections incorporates a stack of at least two layers of materials (38,40) whose optical indexes are different and chosen so as to lead to the effective optical index of said section.

10. Laser according to claim 2, wherein the periodic arrangements are located in one of the first (6) and second (8) semiconductor confinement layers and comprise a sequence of semiconductor zones (16,18), alternately of type p and type n.

11. Laser according to claim 2, wherein the periodic arrangements are located in one of the first (6) and second (8) semiconductor confinement layers and comprise a sequence of undoped semiconductor zones or semi-insulating zones, alternating with semiconductor zones having a doping type identical to that of the semiconductor confinement layer in which said periodic arrangements are located.

12. Laser according to claim 2, wherein the passive part of the laser also incorporates an intermediate phase section (SP) positioned between the switching sections (SC1,SC2, SC3) and the active part (SA) of the laser and permitting a continuous tuning of the emission wavelength of the laser by injecting an electric current into the p-n junction part relative to said intermediate section or by reverse biasing of said junction.

13. Laser according to claim 2, further comprising means (26) for injecting an electric current selectively into the p-n junction parts respectively corresponding to the switching sections, each periodic arrangement being able to spatially modulate the entry of electric current into the guidance layer part corresponding to said arrangement.

14. Laser according to claim 2, further comprising means (28) for the selective reverse biasing of the p-n junction parts respectively corresponding to the switching sections, each periodic arrangement being able to spatially modulate the electric field in the p-n junction part corresponding to said arrangement.

* * * * *

UNITED STATES PATENT AND TRADEMARK OFFICE
CERTIFICATE OF CORRECTION

PATENT NO. : 5,581,572
DATED : December 3, 1996
INVENTOR(S) : Franck Delorme et al.

Page 1 of 3

It is certified that error appears in the above-indentified patent and that said Letters Patent is hereby corrected as shown below:

ON THE TITLE PAGE:

Item ]56]
Under references cited, insert the following references:

Under U.S. Patent Documents:

--4,932,032    6/1990    Kock et al.--

Under Foreign Patent Documents:

--59-031088    2/1984    Japan
  61-014787    1/1986    Japan
  61-191093    8/1986    Japan--

Under Other Publications:

--IEEE Photonics Techn. Lett., Vol. 4, No. 4, April 1992, L.A. Wang et al: "Integrated Four-Wavelength DFB Laser Array with 10 Gb/s Speed and 5nm Continuous Tuning Range".

Proceedings OFC/IOOC'93, Paper PD23, P. 95, San Jose, USA, pgs. 21-26, February 1993, T. L. Koch et al.: "Incoherent Contact-Print Grating Technology for WDM Laser Sources".

IEEE Photon. Technol. Lett., Vol. 2, No. 8, August 1990, pgs. 529-530, M. Oaki et al.: "Corrugation-Pitch-Modulated MQW-DFB Laser with Narrow Spectral Linewidth (170 kHz)".

UNITED STATES PATENT AND TRADEMARK OFFICE
CERTIFICATE OF CORRECTION

PATENT NO. : 5,581,572                                  Page 2 of 3
DATED      : December 3, 1996
INVENTOR(S): Franck Delorme et al.

It is certified that error appears in the above-indentified patent and that said Letters Patent is hereby corrected as shown below:

Proceedings 13th IEEE Int'l. Semicon. Laser Conf., Paper 6, September 21-25, 1992, Takamatsu, Japan, pgs. 268-269, Y. Tohmori et al: "Ultrawide Wavelength Tuning with Single Longitudinal Mode By Super Structure Grating (SSG) DBR Lasers".--.

Column 2, line 49, delete "form," and insert --form--.

Column 5, line 10, delete "passsive" and insert --passive--;

line 33, delete "whilst" and insert --while--; and line 42, delete "layer" (first occurrence).

Column 6, line 11, delete "pof" and insert --of--;

line 23, delete "in" (first occurrence); and line 48, delete "12_" and insert --12--.

UNITED STATES PATENT AND TRADEMARK OFFICE
CERTIFICATE OF CORRECTION

PATENT NO. : 5,581,572
DATED : December 3, 1996
INVENTOR(S) : Franck Delorme et al.

It is certified that error appears in the above-indentified patent and that said Letters Patent is hereby corrected as shown below:

Column 9, line 47 (Claim 1, line 10) after "(SC1,SC2,SC3)" insert --,-- (comma); and line 49, (Claim 1, line 12) delete "a1,a2,a3,A)" and insert --(a1,a2,a3,A)--.

Column 10, line 13 (Claim 2, line 17) delete "section," and insert --section, a--.

Signed and Sealed this

Tenth Day of June, 1997

Attest:

Attesting Officer

BRUCE LEHMAN

Commissioner of Patents and Trademarks